(12) United States Patent
Johnson

(10) Patent No.: US 9,778,043 B1
(45) Date of Patent: Oct. 3, 2017

(54) AIDED INS MICROCHIP ASSEMBLIES AND RELATED METHODS

(71) Applicant: Inertial Sense, LLC, Salem, UT (US)

(72) Inventor: Walter H. Johnson, Salem, UT (US)

(73) Assignee: INERTIAL SENSE, LLC, Salem, UT (US)

( * ) Notice: Subject to any disclaimer, the term of this patent is extended or adjusted under 35 U.S.C. 154(b) by 0 days.

(21) Appl. No.: 15/080,425

(22) Filed: Mar. 24, 2016

Related U.S. Application Data

(60) Provisional application No. 62/138,261, filed on Mar. 25, 2015.

(51) Int. Cl.
*G01C 21/16* (2006.01)
*G01S 19/13* (2010.01)

(52) U.S. Cl.
CPC .......... *G01C 21/165* (2013.01); *G01S 19/13* (2013.01)

(58) Field of Classification Search
None
See application file for complete search history.

(56) References Cited

U.S. PATENT DOCUMENTS

| 2013/0317741 A1* | 11/2013 | Brashear | G01C 21/165 |
| | | | 701/472 |
| 2015/0183635 A1* | 7/2015 | Lee | B81B 7/008 |
| | | | 257/419 |
| 2016/0131484 A1* | 5/2016 | Shekhar | G06K 9/00335 |
| | | | 702/153 |

* cited by examiner

*Primary Examiner* — Nicholas Kiswanto
*Assistant Examiner* — Tamara Weber
(74) *Attorney, Agent, or Firm* — Phillips Ryther & Winchester; Matthew D. Thayne

(57) ABSTRACT

Microchip assemblies, such as self-contained, aided, INS microchip assemblies configured for being coupled with a circuit board or another electrical component. In some embodiments, two inertial navigation sensors may be provided, along with a receiver configured to receive an external signal comprising location data or another aiding sensor, such as a barometric pressure sensor, magnetometer, or WIFI receiver. The assembly may further comprise a processor configured to receive inertial parameter data from inertial navigation sensors and location data from the receiver, and may be configured to process the inertial parameter data and location data to output inertial navigation information.

18 Claims, 1 Drawing Sheet

AIDED INS MICROCHIP ASSEMBLIES AND RELATED METHODS

RELATED APPLICATIONS

This application claims the benefit under 35 U.S.C. §119(e) of U.S. Provisional Patent Application No. 62/138,261 filed Mar. 25, 2015 and titled "AIDED INS MICROCHIP ASSEMBLIES AND RELATED METHODS," which application is incorporated herein by reference in its entirety.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which.

DETAILED DESCRIPTION

Figure 1:
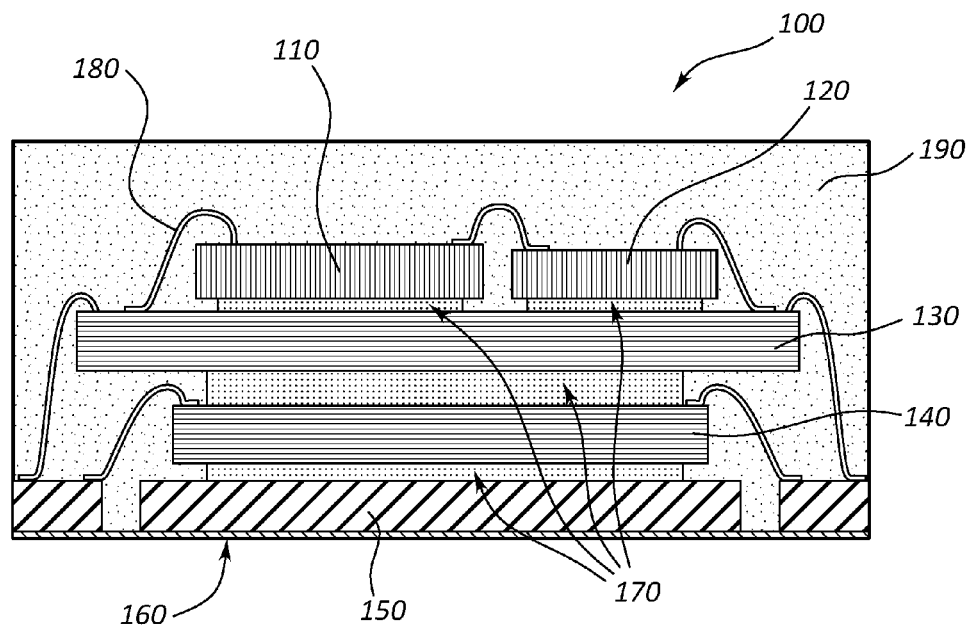
FIG. 1 is a cross-sectional view of one embodiment of a microchip assembly for use in an inertial navigation system.

A detailed description of apparatus, systems, and methods consistent with various embodiments of the present disclosure is provided below. It will be readily understood that the components of the present disclosure, as generally described and illustrated in the drawings herein, could be arranged and designed in a wide variety of different configurations. Thus, the following more detailed description of the embodiments of the apparatus is not intended to limit the scope of the disclosure, but is merely representative of possible embodiments of the disclosure. In addition, while numerous specific details are set forth in the following description in order to provide a thorough understanding of the embodiments disclosed herein, some embodiments can be practiced without some or all of these details. Moreover, for the purpose of clarity, certain technical materials, structures, or operations that are known in the related art have not been shown or described in detail in order to avoid unnecessarily obscuring the disclosure.

Various embodiments of apparatus, methods, and systems are disclosed herein that relate to integrated circuit packages or microchip assemblies utilizing a combination of elements, such as integrated circuit die and/or micro electro mechanical systems (MEMS) elements, that are used for inertial navigation systems, such as Global Navigation Satellite System (GNSS) or Global Positioning System (GPS) aided inertial navigation systems, into a single, discrete, integrated circuit (IC) package.

Inertial navigation systems may be used to perform state estimation for orientation (roll, pitch, heading, or quaternions), velocity, and position, which may provide data for a device or system. In some embodiments, the primary input for an inertial navigation system may be angular rates (from gyroscopes, for example) and accelerations (from accelerometers, for example). In some embodiments, an inertial navigation system (INS) may use additional "aiding" sensors or other similar information to compensate or correct for inaccuracies in an INS state estimation. Sources for the aiding information may come from gyroscopes, accelerometers, a GNSS (or GPS) receiver, magnetometers, barometric pressure sensors, other sensors, or online systems that may share position, altitude, orientation, velocity, acceleration or any subsets of this data.

Previously, GNSS or GPS inertial navigation systems have typically been distributed among multiple IC packages or even multiple electronic printed circuit board assemblies. For example, various components typically provided in separate packages may be combined to provide for a combination of functions such as inertial measurement, inclination, rotation, vertical reference, attitude heading reference (AHRS), and/or global navigation satellite system (GNSS) and/or GNSS aided inertial navigation system (GNSS-INS) outputs. By providing such functionality in a single package, multiple components of an inertial navigation system may be replaced with a single component, or at least fewer components, thereby reducing size, weight, power, and/or cost.

In some embodiments, a GPS/INS microchip assembly or package may comprise an inertial measurement unit comprising one or more gyros and accelerometers, a GPS or GNSS receiver, and a processor or other device for signal processing with equivalent functionality, such as a field-programmable gate array (FPGA), another programmable logic device, or another similar device capable of receiving sensor signals and running or replicating suitable GPS/INS algorithms.

It is thought that such embodiments may be useful for a variety of applications, including, for example, mobile phones and other portable devices. Such devices and other similar devices wherein size/space are very important may be most suitable for incorporating the inventive concepts disclosed herein. In some embodiments, all of the aforementioned components may be combined together as a discrete unit and placed onto a printed circuit board.

It is contemplated that certain preferred embodiments may comprise one or more of these components all on a single microchip. This microchip may then be placed onto or otherwise coupled with a printed circuit board. In other words, in certain preferred embodiments, the assembly may lack a circuit board. Providing all of these various components on a single microchip, which can then be coupled to a separate circuit board, may be beneficial to allow for providing a discrete, complete, INS or aided INS package that can be easily soldered or otherwise coupled to a circuit board to augment the functionality of the circuit board without completely replacing the circuit board. In some such embodiments, the entire microchip may be encapsulated in a liquid or solid encapsulant material, such as a plastic material. In some embodiments, the entire microchip may comprise a stacked assembly comprising a plurality of elements stacked together on a single microchip assembly.

In some embodiments, a single microchip assembly/package may comprise a full inertial navigation system solution, including estimations of orientation, velocity, and position, onboard the package. Position and/or velocity aiding data may be provided by a GPS or another GNSS receiver or, alternatively, or additionally, may be provided by one or more additional supplementary position sensors, such as barometric pressure sensors, magnetometers, WIFI receivers, or other devices configured to sense or otherwise compile information that may be used, either alone or in conjunction with other sensors or devices, to provide inertial navigation aiding data. In some such embodiments, a full inertial navigation system may be provided in a single package. In other words, it may not be necessary to include any other elements or components in order to provide full and accurate locational (position), information, along with velocity and/or acceleration information, for use in an inertial navigation system.

In some embodiments, the GNSS (or GPS) receiver may utilize either a passive or active antenna with associated components that may be external to the GPS/INS microchip assembly/package. This antenna with associated components may electrically interface with the GPS/INS microchip assembly/package through printed circuit board electrical traces.

In some embodiments, electrical decoupling or bypass capacitors and/or other power conditioning components may be located external to the GPS/INS microchip assembly/package.

In some embodiments, the assembly/package may therefore provide one or more relativistic motion inertial navigation sensors configured to sense data directly that may be used in an inertial navigation system to compute relativistic parameters, such as velocity, acceleration and one or more absolute positional or directional sensors or position aiding sensors/devices, such as a GPS or another GNSS receiver, barometric pressure sensors, magnetometers, or WIFI receivers, for use in assisting the relativistic motion inertial navigation sensors in arriving at useful INS information. The absolute sensors may be used in conjunction with the relativistic sensors to provide a full data set for an inertial navigation system. In other words, data from the absolute sensors/devices may be used to complement or aid the relativistic inertial navigation sensors alone.

In some embodiments, multiple absolute sensors may be provided such that, in situations where one such sensor may not be effective, or may for some reason be less effective, other sensors may fill in the data gap. For example, when a user's surroundings render a magnetometer not as useful, perhaps due to an interfering magnetic field or a nearby metal object, a WIFI receiver and/or GPS receiver may be used to provide data missing from the magnetometer. Similarly, when the precision of the locational data provided from a GPS receiver is not sufficient, a WIFI receiver, barometric pressure sensor, and/or magnetometer may be used to correct for errors and/or provide enhanced accuracy.

In some embodiments comprising a magnetometer, the magnetometer may be used to provide positional and/or directional information, rather than merely to assist the motion sensors, by using, for example, a magnetic heading. Similarly, barometric pressure sensors may be used to provide positional and/or directional information by using, for example, barometric pressure altitude correlations.

In some embodiments, no external processor or GNSS (or GPS) receiver may be needed in order to gather and process all the needed state estimation data for a complete INS solution.

In some embodiments, Real-Time Kinematic (RTK) GNSS (or GPS) technology or Differential GPS (D-GPS) technology may be incorporated into the GNSS (or GPS) receiver, or the INS processor, thereby improving the GPS or INS position estimate accuracy.

In some embodiments, the INS aiding may be provided to the GPS/INS microchip assembly/package via an integrated signal, such as, for example, Coning and Sculling integrals (delta theta angles and delta velocities) providing inertial measurement unit (IMU) data to the INS.

In some embodiments, the INS state estimation may be either a loosely coupled or a tightly coupled system. The loosely coupled system may utilize GNSS (or GPS) position and/or velocity data as an input to the primary state estimation filter. The tightly coupled system may utilize GNSS (or GPS) raw data (pseudorange, doppler, carrier phase, phase lock, signal quality, timing, etc.) as an input to the primary state estimation filter.

In some embodiments, sensor calibration may be stored in memory, such as non-volatile memory, which may be located on the microchip assembly. In some such embodiments, this calibration may contain correction factors for temperature, cross-axis alignment, scale factor, gravitational or acceleration effects, and/or related calibration.

Additional details regarding certain preferred embodiments will now be described in greater detail with reference to the accompanying drawings. FIG. 1 depicts an example of an integrated circuit assembly 100 for use in inertial navigation systems according to one embodiment. Integrated circuit assembly 100 comprises a first inertial navigation sensor 110 and a second inertial navigation sensor 120. In some embodiments, one or both of the first and second inertial navigation sensors may comprise a gyroscope and/or an accelerometer. In some preferred embodiments, first inertial navigation sensor 110 may comprise a gyroscope and second inertial navigation sensor 120 may comprise an accelerometer, or vice versa. In some embodiments, one or both of the first and second inertial navigation sensors may comprise microelectromechanical systems (MEMS) components. Thus, for example, first inertial navigation sensor 110 may comprise a MEMS gyroscope and second inertial navigation sensor 120 may comprise a MEMS accelerometer, or vice versa.

In some embodiments, additional inertial navigation aiding sensors may be included, such as a magnetometer and/or barometric pressure sensor.

Integrated circuit assembly 100 further comprises a processor 130. In alternative embodiments, processor 130 may be replaced with another device for signal processing with equivalent functionality, such as a field-programmable gate array (FPGA), another programmable logic device, or another similar device capable of receiving sensor signals and running or replicating suitable GPS/INS algorithms. Each of the foregoing, including processor 130, should be considered examples of means for processing inertial navigation signals.

Integrated circuit assembly 100 further comprises an aiding sensor 140, which may comprise a receiver 140. Receiver 140 preferably comprises a GPS receiver or a GNSS receiver. Receiver 140 may be configured to receive and process a signal from an external device used for inertial navigation, such as a GPS or GNSS satellite, for example. Alternatively, aiding sensor 140 may comprise another type of sensor configured for aiding the input from the first inertial navigation sensor 110 and the second inertial navigation sensor 120 to provide more accurate inertial navigation information. Further processing of such signals may be accomplished using processor 130.

It should be understood that, in other embodiments, receiver 140 may be included in addition to one or more additional aiding sensors/elements, such as barometric pressure sensors, magnetometers, WIFI receivers, or other devices configured to sense or otherwise compile information that may be used to correct or augment data from first inertial navigation sensor 110 and second inertial navigation sensor 120 to provide more accurate inertial navigation information.

Integrated circuit assembly 100 further comprises one or more leads 150, which may be used to electrically couple integrated circuit assembly 100 with a circuit board or another electrical component. A thermal pad 160 may be coupled with lead(s) 150 and/or other components of the assembly. A die attach pad or another die attach material 170 may be positioned on one or both sides of one or more of the various elements. Thus, in the depicted embodiment, a die attach 170 is positioned between first inertial navigation sensor 110 and processor 130, and similarly between second inertial navigation sensor 120 and processor 130. Other die attaches 170 are positioned between processor 130 and receiver 140, and between receiver 140 and lead(s) 150, respectively.

Various wires, such as bondwires 180, may be positioned to interconnect various components of integrated circuit assembly 100, as illustrated in FIG. 1. In addition, some embodiments may comprise an encapsulation material 190, such as a plastic material.

Figure 2:
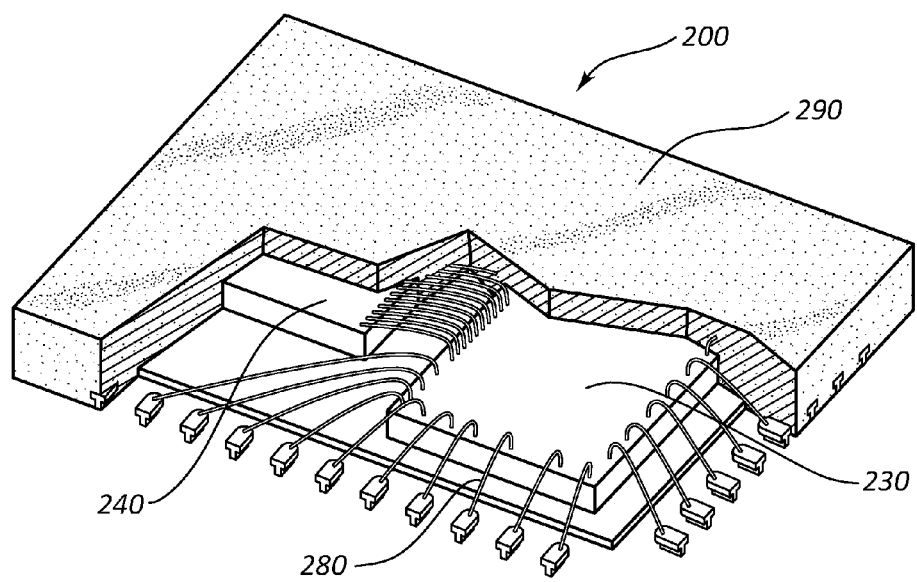
FIG. 2 is a perspective view of another embodiment of a microchip assembly for use in an inertial navigation system.

Although the embodiment depicted in FIG. 1 comprises a stacked package, one or more (or all) of the various components of the assembly may instead be positioned adjacent to one another in alternative embodiments. Thus, FIG. 2 depicts an alternative embodiment of an integrated circuit assembly 200 for use in inertial navigation systems. Integrated circuit assembly 200 comprises a processor 230 and a receiver 240 positioned adjacent to processor 230. Receiver 240 preferably comprises a GPS receiver or a GNSS receiver configured to receive and process a signal from an external device used for inertial navigation, such as a GPS or GNSS satellite. Such signals may be further processed using processor 230. Various wires, such as bondwires 280, may be used to electrically couple processor 230 and receiver 240 and may similarly be used to couple one or more components of integrated circuit assembly 200 with an external component or a component configured to facilitate coupling with such a component, such as one or more leads for coupling integrated circuit assembly 200 to a circuit board.

Preferably, integrated circuit assembly 200 further comprises other inertial navigation components, as described above. Thus, for example, integrated circuit assembly 200 may further comprise one or more inertial navigation sensors, similar to first inertial navigation sensor 110 and second inertial navigation sensor 120 described above. In some embodiments, one or both of the first and second inertial navigation sensors may comprise a gyroscope and/or an accelerometer. Although not depicted in FIG. 2, these elements may be positioned adjacent to processor 230 and receiver 240 or, alternatively, may be stacked above or below processor 230 and/or receiver 240, as desired for a particular application.

In a particular example of an integrated circuit assembly for inertial navigation systems according to some embodiments, the assembly may comprise:

a first inertial navigation sensor configured to sense one or more inertial parameters;

a second inertial navigation sensor configured to sense one or more inertial parameters;

a receiver configured to receive an external signal comprising location data; and a processor configured to receive inertial parameter data from the first inertial navigation sensor and the second inertial navigation sensor, location data from the receiver, and process the inertial parameter data and location data to output inertial navigation information.

In some embodiments, one or more aiding sensors may also be provided. In such embodiments, the processor may be configured to receive inertial parameter data from the first inertial navigation sensor, the second inertial navigation sensor, and the one or more aiding sensors, and process the inertial parameter data to output inertial navigation information.

In some embodiments, the integrated circuit assembly may further comprise additional secondary or aiding sensors, or may comprise an interface for receiving data from such aiding sensors. For example, in some embodiments, a magnetometer and/or barometric pressure aiding sensor may be provided.

Thus, in another particular example of an integrated circuit assembly for inertial navigation systems according to some embodiments, the assembly may comprise:

at least one of an absolute positional sensor and an aiding positional sensor for receiving positional information for detecting an absolute position of a device incorporating the integrated circuit assembly;

at least one motional inertial navigation sensor configured to sense one or more inertial parameters comprising at least one of velocity, acceleration, and orientation; and an onboard processor configured to receive inertial parameter data from the at least one motional inertial navigation sensor, positional data from the at least one of an absolute positional sensor and an aiding positional sensor, and to process the inertial parameter data and the positional data to output inertial navigation information comprising both absolute positional data and relativistic motion data.

In some embodiments, the absolute positional sensor may comprise a GNSS receiver. In some embodiments, the aiding positional sensor may comprise at least one of a magnetometer and a barometric sensor. In some embodiments, the at least one motional inertial navigation sensor may comprise a gyroscope and an accelerometer.

Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, inventive aspects lie in a combination of fewer than all features of any single foregoing disclosed embodiment.

Those having skill in the art will appreciate that many changes may be made to the details of the above-described embodiments without departing from the underlying principles of the invention. The scope of the present invention should, therefore, be determined only by the following claims.

The invention claimed is:

1. A microchip assembly comprising a plurality of die pieces formed into a single semiconductor package, comprising:

a first inertial navigation sensor configured to sense one or more inertial parameters;

a second inertial navigation sensor configured to sense one or more inertial parameters;

a receiver configured to receive an external signal comprising location data;

a processor, wherein the processor is configured to receive inertial parameter data from the first inertial navigation sensor, inertial parameter data from the second inertial navigation sensor, and location data from the receiver, and wherein the processor is configured to process the inertial parameter data and location data to output inertial navigation information; and an encapsulation material encapsulating the first inertial navigation sensor, the second inertial navigation sensor, the receiver, and the processor together in a single package.

2. The microchip assembly of claim 1, wherein the first inertial navigation sensor comprises an accelerometer, and wherein the second inertial navigation sensor comprises a gyroscope.

3. The microchip assembly of claim 1, further comprising an aiding sensor configured to generate inertial navigation data to augment data from the first inertial navigation sensor, data from the second inertial navigation sensor, and the location data, wherein the processor is further configured to receive inertial navigation data from the aiding sensor and to use the inertial navigation data from the aiding sensor to generate the inertial navigation information.

4. The microchip assembly of claim 3, wherein the aiding sensor is configured to correct for inaccuracies in the inertial navigation information resulting from use of data from the first inertial navigation sensor, data from the second inertial navigation sensor, and the location data without the aiding sensor.

5. The microchip assembly of claim 3, wherein the aiding sensor comprises at least one of a magnetometer and a barometric pressure sensor.

6. The microchip assembly of claim 1, wherein the receiver comprises at least one of a GPS receiver and a GNSS receiver.

7. The microchip assembly of claim 1, wherein the microchip assembly comprises a stacked assembly.

8. An integrated circuit assembly, comprising:
at least one of an absolute positional sensor and an aiding positional sensor for receiving positional information for detecting an absolute position of a device incorporating the integrated circuit assembly;
at least one motional inertial navigation sensor configured to sense one or more inertial parameters comprising at least one of velocity, acceleration, and orientation; and
an onboard processor configured to receive inertial parameter data from the at least one motional inertial navigation sensor, wherein the onboard processor is further configured to receive positional data from the at least one of an absolute positional sensor and an aiding positional sensor, wherein the onboard processor is further configured to process the inertial parameter data and the positional data to output inertial navigation information, wherein the inertial navigation information comprises absolute positional data and relativistic motion data, wherein the integrated circuit assembly is configured to be coupled to a separate circuit board, and wherein the integrated circuit assembly lacks a circuit board.

9. The integrated circuit assembly of claim 8, wherein the at least one motional inertial navigation sensor comprises a gyroscope.

10. The integrated circuit assembly of claim 9, wherein the at least one motional inertial navigation sensor further comprises an accelerometer.

11. The integrated circuit assembly of claim 8, wherein the at least one of an absolute positional sensor and an aiding positional sensor comprises an absolute positional sensor comprising at least one of a GPS receiver and a GNSS receiver, and wherein the absolute positional sensor is configured to receive an external signal comprising location data, and wherein the onboard processor is configured to combine the location data with the inertial parameter data to generate the inertial navigation information.

12. The integrated circuit assembly of claim 11, wherein the at least one of an absolute positional sensor and an aiding positional sensor further comprises an aiding positional sensor, and wherein the aiding positional sensor comprises at least one of a barometric pressure sensor, a magnetometer, and a WIFI receiver.

13. A microchip assembly comprising a plurality of die pieces formed into a single semiconductor package, comprising:
a gyroscope configured to generate a first set of inertial navigation data;
an accelerometer configured to generate a second set of inertial navigation data;
an aiding sensor configured to generate a third set of inertial navigation data to augment the first set of inertial navigation data and the second set of inertial navigation data; and
a processor, wherein the processor is configured to receive the first set of inertial navigation data from the gyroscope, the second set of inertial navigation data from the accelerometer, and the third set of inertial navigation data from the aiding sensor, wherein the processor is configured to process the first set of inertial navigation data, the second set of inertial navigation data, and third set of inertial navigation data to output inertial navigation information, and wherein the microchip assembly comprises a stacked assembly comprising the gyroscope, the accelerometer, the aiding sensor, and the processor together in a single package.

14. The microchip assembly of claim 13, wherein the aiding sensor comprises an absolute positional sensor.

15. The microchip assembly of claim 14, wherein the absolute positional sensor comprises a receiver configured to receive an external signal comprising location data.

16. The microchip assembly of claim 13, wherein the aiding sensor comprises at least one of a barometric pressure sensor, a magnetometer, and a WIFI receiver.

17. The microchip assembly of claim 13, wherein each of the gyroscope, the accelerometer, the aiding sensor, and the processor is in a stacked configuration with respect to one another.

18. The microchip assembly of claim 13, further comprising a plurality of leads configured to electrically couple the microchip assembly with a circuit board, wherein the microchip assembly lacks a circuit board.

* * * * *